(12) United States Patent
West et al.

(10) Patent No.: US 11,870,372 B2
(45) Date of Patent: Jan. 9, 2024

(54) FLEXIBLE AND HYBRID ENERGY HARVESTING DEVICE COMBINING PIEZOELECTRIC AND ELECTROSTATIC CONVERSIONS

(71) Applicant: THE JOHNS HOPKINS UNIVERSITY, Baltimore, MD (US)

(72) Inventors: James West, Baltimore, MD (US);
Ugur Erturun, Baltimore, MD (US);
Sung Hoon Kang, Lutherville-Timonium, MD (US);
Adebayo Eisape, Baltimore, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 452 days.

(21) Appl. No.: 17/059,735

(22) PCT Filed: Jun. 11, 2019

(86) PCT No.: PCT/US2019/036481
§ 371 (c)(1),
(2) Date: Nov. 30, 2020

(87) PCT Pub. No.: WO2019/241202
PCT Pub. Date: Dec. 19, 2019

(65) Prior Publication Data
US 2021/0218350 A1    Jul. 15, 2021

Related U.S. Application Data

(60) Provisional application No. 62/683,448, filed on Jun. 11, 2018.

(51) Int. Cl.
*H02N 2/18*    (2006.01)
*H02N 1/08*    (2006.01)
(Continued)

(52) U.S. Cl.
CPC .............. *H02N 2/186* (2013.01); *H02N 1/08* (2013.01); *H02N 2/181* (2013.01); *H10N 30/30* (2023.02);
(Continued)

(58) Field of Classification Search
CPC .......... H02N 2/181; H02N 2/186; H02N 1/08; H10N 30/852; H10N 30/872; H10N 30/30
See application file for complete search history.

(56) References Cited

U.S. PATENT DOCUMENTS 7,304,416 B2   12/2007  Mullen
7,839,058 B1   11/2010  Churchill et al.
(Continued)

FOREIGN PATENT DOCUMENTS

CN    102677846 A    9/2012
CN    110061652 A  * 7/2019    ............... H02N 1/08
(Continued)

OTHER PUBLICATIONS

International Search Report and Written Opinion in corresponding International Application No. PCT/US2019/036481 dated Sep. 19, 2019, 6 pages.
(Continued)

*Primary Examiner* — J. San Martin
(74) *Attorney, Agent, or Firm* — MH2 TECHNOLOGY LAW GROUP LLP (57) ABSTRACT

Disclosed are device implementations for a hybrid energy harvesting device and methods for harvesting mechanical energy from the ambient. The various device implementations utilize a combination of electrostatic energy conversion and piezoelectric energy conversion elements. The method simultaneously converts mechanical energy into electrical charge by electrostatic and piezoelectric energy
(Continued)

harvesting. The devices include a piezoelectric harvester including a pair of electrodes and piezoelectric nanocomposite polymer, an electrostatic harvester including an electret film and a pair of electrostatic electrodes.

18 Claims, 6 Drawing Sheets

(51) Int. Cl.
  *H10N 30/30* (2023.01)
  *H10N 30/85* (2023.01)
  *H10N 30/87* (2023.01)

(52) U.S. Cl.
  CPC ......... *H10N 30/852* (2023.02); *H10N 30/872* (2023.02)

(56) References Cited

U.S. PATENT DOCUMENTS

| | | |
|---|---|---|
| 9,014,818 B2 | 4/2015 | Deterre et al. |
| 2009/0315335 A1 | 12/2009 | Ujihara et al. |
| 2017/0179853 A1 | 6/2017 | Choi et al. |

FOREIGN PATENT DOCUMENTS

| | | | |
|---|---|---|---|
| EP | 3319220 A1 | 5/2018 | |
| JP | 2015122816 A | 7/2015 | |
| JP | 2015220808 A | 12/2015 | |
| KR | 20150139282 A | * 12/2015 | ............... H02N 2/18 |
| WO | 2017135119 A1 | 8/2017 | |

OTHER PUBLICATIONS

Cottone et al., Piezoelectric buckled beams for random vibration energy harvesting., Smart Materials and Structures., (2012), vol. 21(3):035021.

Kim et al., Research Update: Hybrid energy devices combining nanogenerators and energy storage systems for self-charging capability., APL Materials., (2017), vol. 5(7):073804.

Lee et al., All-in-one energy harvesting and storage devices., Journal of Materials Chemistry A., (2016), pp. 7983-7999, vol. 4(21).

Chu et al., Opportunities and challenges for a sustainable energy future., Nature., (2012), pp. 294-303, vol. 488.

Li et al., Analytical, numerical, and experimental studies of viscoelastic effects on the performance of soft piezoelectric nanocomposites., Nanoscale., (2017), pp. 14215-14228, vol. 9(37).

* cited by examiner

FLEXIBLE AND HYBRID ENERGY HARVESTING DEVICE COMBINING PIEZOELECTRIC AND ELECTROSTATIC CONVERSIONS

CROSS REFERENCE

This is a U.S. National Stage application of PCT/US2019/036481, filed Jun. 11, 2019, and claims priority to U.S. Provisional Patent Application No. 62/683,448, which was filed Jun. 11, 2018, the disclosures of which are incorporated herein by reference in their entireties.

GOVERNMENT SUPPORT STATEMENT

This invention was made with government support under Grant No. N000140610961 awarded by the Office of Naval Research. The government has certain rights in the invention.

FIELD

The present teachings relate generally to systems and methods for energy conversion and, more particularly, to systems and methods for harvesting mechanical energy from the ambient.

BACKGROUND

Demand for flexible and wearable electronics is an increasing trend. However, a reliable and long-lasting energy supply for such systems is a challenge as conventional batteries, while continuing to improve, are not practical and reliable for an extended period of time.

Energy harvesting (EH) has been used to convert existing environmental energy such as mechanical energy, thermal energy, and solar energy into electric energy. Energy harvesting has the potential to provide a reliable and power supply, or to augment an existing battery supply. In particular, mechanical energy is an attractive source for energy harvesting as it potentially available from any kinetic system such as movement of the human body itself. Further, the development of small electronic components and devices that have a low power consumption make energy harvesting more applicable. In recent years, increasing wireless medical sensor applications and the ubiquity of human motion has accelerated the development of energy harvesting devices that can be attached to the human body and harvest energy from human movement.

An improved method and system for harvesting mechanical energy from an ambient source would be a welcome addition to the art.

SUMMARY

The following presents a simplified summary in order to provide a basic understanding of some aspects of one or more examples of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation of the present teachings, an energy harvesting device for energy harvesting includes a piezoelectric harvester having a first piezoelectric electrode, a second piezoelectric electrode, and a piezoelectric nanocomposite positioned between the first piezoelectric electrode and the second piezoelectric electrode, and further includes an electrostatic harvester having a first electrostatic electrode, a second electrostatic electrode, and an electret film positioned between the first electrostatic electrode and the second electrostatic electrode. In this implementation, the piezoelectric nanocomposite is physically positioned between the first piezoelectric electrode and the first electrostatic electrode.

Optionally, the first electrostatic electrode, the second electrostatic electrode, and the electret film are positioned directly between the first piezoelectric electrode and the second piezoelectric electrode. Further, the piezoelectric nanocomposite can physically support the first piezoelectric electrode, the second piezoelectric electrode, the first electrostatic electrode, and the second electrostatic electrode. The piezoelectric nanocomposite can include a first section that physically supports the first piezoelectric electrode and the first electrostatic electrode, and a second section that physically supports the second piezoelectric electrode and the second electrostatic electrode, wherein the first section is physically and electrically attached to the second section.

In an implementation of the energy harvesting device, the piezoelectric nanocomposite includes a post and the second electrostatic electrode includes a first aperture therethrough, wherein the post extends through the first aperture. Further, the electret film has a second aperture therethrough, wherein the post extends through the second aperture. The piezoelectric nanocomposite, the first electrostatic electrode, and the electret film can form a gap filled with a gas, and the gap can be positioned between, and can separate, the electret film and the first electrostatic electrode.

Optionally, the piezoelectric nanocomposite can provide a cylinder having a longitudinal axis that extends through the cylinder. The energy harvesting device can include a gap positioned at and around the longitudinal axis, wherein the gap can be positioned between, and can separate, the electret film and the first electrostatic electrode.

The energy harvesting device can include a height and a width. When the energy harvesting device is in a relaxed state, the height can vary from the width by no more than ±3% and, when the energy harvesting device is in a compressed state, the width can be from about 10% to about 100% greater than the height. In an implementation, in a cross section through the energy harvesting device, the first piezoelectric electrode, the second piezoelectric electrode, and the piezoelectric nanocomposite each form an endless circle and, in the cross section, the first electrostatic electrode, the second electrostatic electrode, and the electret film can each form an arc.

The piezoelectric nanocomposite can be physically positioned between the second piezoelectric electrode and the second electrostatic electrode, and the piezoelectric nanocomposite can physically support the first piezoelectric electrode, the second piezoelectric electrode, the first electrostatic electrode, and the second electrostatic electrode.

Further, the energy harvesting device can further include a gap positioned between the first electrostatic electrode and the electret film, and the gap can be filled with a gas. The piezoelectric nanocomposite can include a surface having at least one arch, the second piezoelectric electrode can be a first conformal layer positioned on the surface and includes an arch, and the energy harvesting device can further include an insulator, where the insulator is a second conformal layer positioned on the second piezoelectric electrode and includes an arch. The first electrostatic electrode can be a third conformal layer positioned on the insulator and can include an arch. The electret film can be a planar electret film positioned on the first electrostatic electrode, and the second electrostatic electrode can be a planar second electrostatic electrode positioned on the electret film.

In an implementation, the energy harvesting device can further include at least one gas-filled gap positioned between, and defined by, the first electrostatic electrode and the electret film. The piezoelectric nanocomposite can include a plurality of arches that form a scalloped surface of the piezoelectric nanocomposite, and the energy harvesting device can further include a plurality of gas-filled gaps positioned between, and defined by, the first electrostatic electrode and the electret film.

The energy harvesting device can further include a relaxed state in which the energy harvesting device has a first thickness, and a compressed state in which the energy harvesting device includes a second thickness, where the second thickness is less than the first thickness. In the relaxed state, the at least one gap can have a first height, and in the compressed state, the at least one gap can have a second height, where the second height is less than the first height.

In another implementation, an energy harvesting system includes an energy harvesting device having a piezoelectric harvester including a first piezoelectric electrode, a second piezoelectric electrode, and a piezoelectric nanocomposite positioned between the first piezoelectric electrode and the second piezoelectric electrode. The energy harvesting system further includes an electrostatic harvester having a first electrostatic electrode, a second electrostatic electrode, and an electret film positioned between the first electrostatic electrode and the second electrostatic electrode. The energy harvesting system additionally includes a piezoelectric energy harvesting circuit electrically coupled to the piezoelectric harvester, wherein the piezoelectric energy harvesting circuit is configured to convert piezoelectric energy to electric energy, and an electrostatic energy harvesting circuit electrically coupled to the electrostatic harvester, wherein the electrostatic energy harvesting circuit is configured to convert electrostatic energy to electric energy. The energy harvesting system further includes an electric energy storage system electrically coupled to the piezoelectric energy harvesting circuit and the electrostatic energy harvesting circuit.

The energy harvesting system can optionally include at least one gas-filled gap positioned between the first electrostatic electrode and the second electrostatic electrode. The piezoelectric nanocomposite can provide a cylinder having a longitudinal axes that extends through the cylinder.

In another implementation, a method for generating electric energy using an energy harvesting device includes moving a first piezoelectric electrode supported by a piezoelectric nanocomposite and a second piezoelectric electrode supported by the piezoelectric nanocomposite relative to each other thereby generating a first portion of the electric energy, and moving a counter electrode supported by the piezoelectric nanocomposite and an electret film supported by the piezoelectric nanocomposite relative to each other thereby generating a second portion of the electric energy. Further, the generating of the first portion of the electric energy occurs simultaneously with the generating of the second portion of the electric energy.

BRIEF DESCRIPTION OF THE DRAWINGS

The accompanying drawings, which are incorporated in and constitute a part of this specification, illustrate examples of the present teachings and together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary examples of the present teachings, examples of which are illustrated in the accompanying drawings. Generally and/or where convenient, the same reference numbers will be used throughout the drawings to refer to the same or like parts.

Harvesting energy from ambient sources has had limited success. The energy required by a typical electronic device has been too high, and the energy generated by energy harvesting (EH) systems has been too low, to render the large-scale integration of EH systems into electronic devices cost effective.

The present teachings include a device for energy harvesting. An EH device as described herein includes both an electrostatic harvester and a piezoelectric harvester and is thus referred to as a "hybrid" energy harvesting device or hybrid energy harvester. The electrostatic harvester and the piezoelectric harvester can include one or more shared structures that are used by both devices during the conversion of mechanical energy into electric energy. In an implementation, the one or more shared structures can include a piezoelectric nanocomposite that functions electrically as part of the piezoelectric harvester as well as an elastically compressible support for a pair of piezoelectric electrodes and a pair of electrostatic electrodes. The elastically compressible support allows a first electrode of each pair of electrodes to oscillate relative to a second electrode of the respective pair. One of the electrostatic electrodes provides a counter electrode, and the piezoelectric nanocomposite allows the counter electrode to oscillate relative to an electret film. The device thereby generates electric energy by converting both piezoelectric energy and electrostatic energy.

The present teachings further include a method for energy harvesting. The method can include converting mechanical energy into electric energy using a piezoelectric energy generation, and converting mechanical energy into electric energy using an electrostatic generation. The piezoelectric conversion and the electrostatic conversion, as well as the storage of electric energy within (for example) a battery, can occur simultaneously, and can include the use of shared structures. Various example implementations of the present teachings are discussed below. The hybrid EH harvester thus includes a piezoelectric harvester and an electrostatic harvester functioning simultaneously to generate electric energy.

Figure 1:
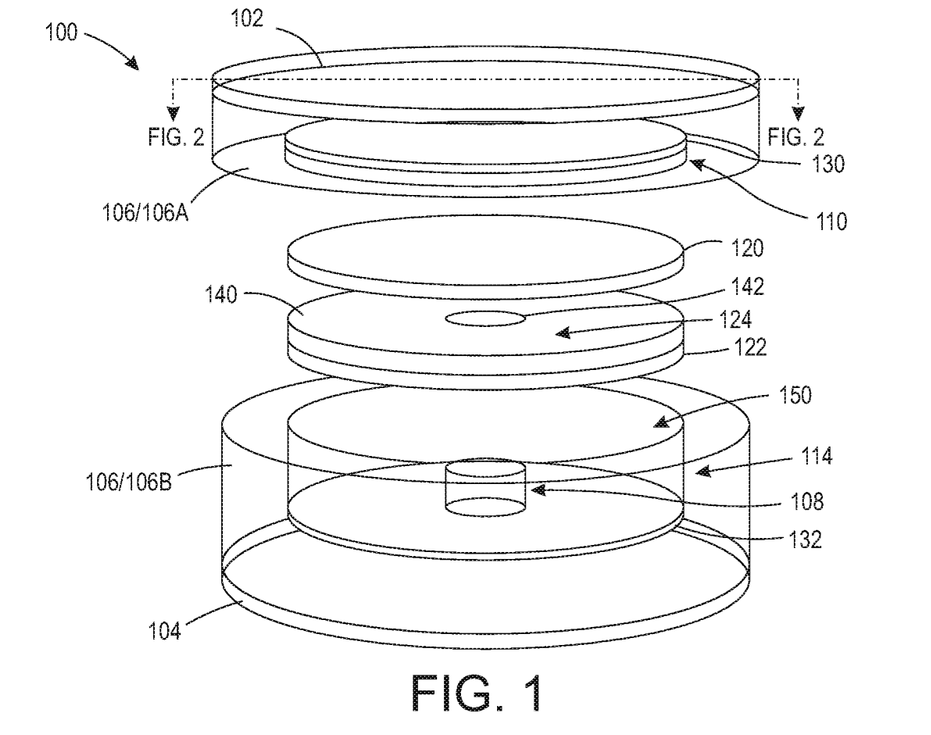
FIG. 1 is a perspective exploded depiction of a flexible and hybrid energy harvesting device according to an implementation of the present teachings
Figure 2:
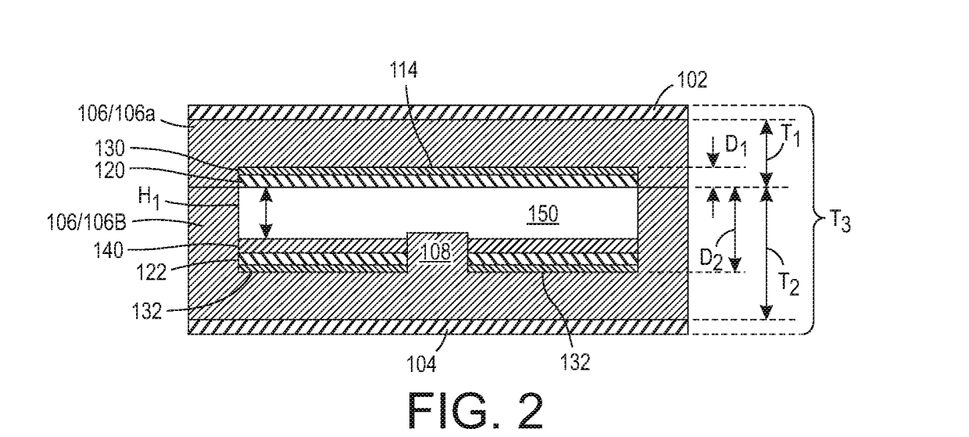
FIG. 2 is a cross section of the FIG. 1 hybrid energy harvesting device in a relaxed state.

Various implementations of a hybrid EH device are contemplated. For example, FIG. 1 is an exploded perspective illustration, and FIG. 2 is an assembled cross section along 2-2 of FIG. 1, depicting a hybrid EH device 100 according to an implementation of the present teachings. The hybrid EH device 100 of FIGS. 1 and 2, and the other implementations discussed below, include various subcomponents as depicted and described herein. It will be appreciated that a hybrid EH device according to the present teachings can include other subcomponents that have not been depicted and/or discussed for simplicity, while various depicted subcomponents can be removed or modified.

The hybrid EH device 100 of FIGS. 1 and 2 includes a first piezoelectric electrode 102 and a second piezoelectric electrode 104. The first piezoelectric electrode 102 is physically spaced from the second piezoelectric electrode 104 using a piezoelectric nanocomposite 106, which also supports the first and second piezoelectric electrodes 102, 104. FIG. 1 further depicts a first electrostatic electrode 120 and a second electrostatic electrode 122. In the orientation depicted in FIG. 2, an upper surface of the first electrostatic electrode 120 is electrically isolated from the piezoelectric nanocomposite 106 using a first electrical insulator (hereinafter "insulator") 130, and a lower surface of the second electrostatic electrode 122 is electrically isolated from the piezoelectric nanocomposite 106 using a second electrical insulator 132. The hybrid EH device 100 further includes an electret film 140 positioned over and on an upper surface of the second electrostatic electrode 122, and electrically coupled with the second electrostatic electrode 122. In other words, the electret film 140 is positioned between the first and second electrostatic electrodes 120, 122, physically and electrically contacting the second electrostatic electrode 122, and physically and electrically isolated from the first electrostatic electrode 120. The hybrid EH device 100 is assembled to include a void, space, or gap 150, such that the first electrostatic electrode 120 provides a counter electrode. As depicted in FIG. 2, for example, the gap 150 is positioned between, and separates, the electret film 140 and the first electrostatic electrode 120. As further depicted in FIG. 2, the gap 150 is formed, at least in part, by the piezoelectric nanocomposite 106, the first electrostatic electrode 120, and the electret film 140. The gap 150 can be filled with a gas such as air, or another suitable gas.

In an implementation, the first and second piezoelectric electrodes 102, 104 can be or include copper (Cu), silver (Ag), gold (Au), or another suitable material. Each piezoelectric electrode 102, 104 can be formed as a wafer having a thickness of from about 0.1 nanometers (nm) to about 100 nm, or from about 1 nm to about 10 nm. The piezoelectric electrodes 102, 104 can further have a diameter of from about 10 mm to about 1000 mm, or from about 20 mm to about 200. The first and second piezoelectric electrodes 102, 104 can be identical to each other, or may have differences in structure, composition, or dimension, depending on the design of the hybrid EH device 100.

The first and second insulator layers 130, 132 can be or include polydimethylsiloxane (PDMS) or Nylon. In an implementation, the first and second insulator layers 130, 132 can be formed as wafers of insulator material prior to assembly of the hybrid EH device 100. In another implementation, the first and second insulator layers 130, 132 can be deposited as a viscous or flowable material and, in addition to providing an electrical insulator, can be used as an adhesive to adhere the first and second electrostatic electrodes 120, 122 to the piezoelectric nanocomposite 106.

The first and second electrostatic electrodes 120, 122 can be or include copper (Cu), silver (Ag), aluminum (Al), or gold (Au). Each electrostatic electrode 120, 122 can be formed as a wafer having a thickness of from about 0.1 nm to about 100 nm, or from about 1.0 nm to about 10 nm. The electrostatic electrodes 120, 122 can further have a diameter of from about 8.0 mm to about 800 mm, or from about 18 mm to about 180 mm. The first and second electrostatic electrodes 120, 122 can be identical to each other, or may have differences in structure, composition, or dimension, depending on the design of the hybrid EH device 100. For example, in the depicted implementation, the first electrostatic electrode 120 is formed as a solid wafer while the second electrostatic electrode 122 includes a first aperture 124. The piezoelectric nanocomposite 106 is formed to include a post 108, wherein the post 108 extends through the first aperture 124. During assembly, the first aperture 124 is positioned over the post 108 of the piezoelectric nanocomposite 106, and the post 108 extends through the first aperture 124, which thereby positions the second electrostatic electrode 122 relative to the piezoelectric nanocomposite 106 and the other structures.

The piezoelectric nanocomposite 106 can be formed to include a first or upper section 106A and a second or lower section 106B, wherein the formation of two separate sections of the piezoelectric nanocomposite 106 facilitates assembly of the hybrid EH device 100 as described below. In an implementation, the piezoelectric nanocomposite 106 can be or include a polymer-based piezoelectric nanocomposite (p-NC) that functions as a piezoelectric converter due. Generally, the piezoelectric nanocomposite should have properties of a high conversion efficiency, elastically compressible, and accommodation of repeated deformation while returning to its original shape upon removal of compressive stress. The piezoelectric nanocomposite is a material that induces an electric charge between the opposing first piezoelectric electrode 102 and the second piezoelectric electrode 104. In an implementation, the piezoelectric nanocomposite 106 can include a polymeric matrix, piezoelectric nanoparticles, and conductive additives. In an implementation, the piezoelectric nanocomposite 106 can be or include a polymeric matrix, for example, a polydimethylsiloxane (PDMS) matrix, with a plurality of piezoelectric nanoparticles such as BaTiO$_3$ piezoelectric nanoparticles (BTO). The piezoelectric nanocomposite 106 can further include multiwalled carbon nanotubes (CNTs) as an electrically conductive additives. A suitable piezoelectric nanocomposite 106 such as the PDMS/BTO/CNT piezoelectric nanocomposite described herein can be synthesized and prepared in any desired shape and size by one of ordinary skill in the art. Alternatively, a 3D printing method can be utilized to prepare piezoelectric nanocomposites in various geometries.

In addition to being mechanically highly flexible (i.e., elastically deformable), the piezoelectric nanocomposite also provides a significant piezoelectric energy harvesting performance. The piezoelectric coefficient or modulus (D33) can be, for example from about 53 picocoulombs per Newton (pC/N) to about 120 pC/N. The piezoelectric nanocomposite can include viscoelastic materials. Both viscous and elastic features of the piezoelectric nanocomposite 106 have a significant impact on the piezoelectric conversion mechanism. The piezoelectric coefficients of the piezoelectric nanocomposite 106 can be increased by changing its viscoelastic properties. Depending on the shape and design, the piezoelectric nanocomposite sections 106A, 106B can be formed, for example, through molding from a liquid precursor or printed using a 3D printing process.

The first section 106A of the piezoelectric nanocomposite 106 can be formed to have a thickness $T_1$ of from about 4.0 mm to about 40. The first section 106A further includes a first recess 110 having a depth $D_1$ of from about 0.2 mm to about 2.0 mm. The first recess 110 receives the first insulator layer 130 and the first electrostatic electrode 120.

The second section 106B of the piezoelectric nanocomposite 106 can be formed to have a thickness $T_2$ of from about 6.0 mm to about 60 mm. The second section 106B further includes a second recess 112 having a depth $D_2$ of from about 5.2 mm to about 22 mm. The second recess 112 receives the second insulator layer 132, the second electrostatic electrode 122, and the electret film 140. The post 108 provided by the second section 106B of the piezoelectric nanocomposite 106 can have a height of from about 5.0 mm to about 20 mm. Referring to FIG. 2, the height of the post 108 is sufficient such that an upper surface 114 of the post 108 is positioned above an upper surface of the electret film 140, thereby preventing physical contact between the first electrostatic electrode 120 and the electret film 140 during operation of the hybrid EH device 100.

The electret film 140 can be formed from a material such as a metallized fluorinated ethylene propylene (FEP) film, where an FEP layer provides the electret film and the metallization provides the second electrostatic electrode 122. The electret film 140 and can have a thickness of from about 25 micrometers (μm) to about 1000 μm, and a diameter of from about 8.0 mm to about 800 mm. The electret film 140 can be formed to include a second aperture 142, wherein the post 108 extends through the second aperture 142. During assembly, the second aperture 142 is positioned over the post 108 of the piezoelectric nanocomposite 106, and the post 108 extends through the second aperture 142, which thereby positions the electret film 140 relative to the piezoelectric nanocomposite 106 and the other structures.

FIG. 1 generally depicts the assembly of each of the components discussed above into the hybrid EH device 100. An electrically conductive adhesive, such as a composite of PDMS and silver nanowires (i.e., PDMS/AgNWs), can be applied to, and positioned between, the piezoelectric nanocomposite sections 106A, 106B to physically and electrically connect the two sections 106A, 106B. Also, an electrically insulative adhesive, which forms insulator layer 132, can be applied to, and positioned between, the second piezoelectric nanocomposite section 106B and the second electrostatic electrode 102, thereby physically attaching the two structures together. In an implementation, a silicone rubber product such as ELASTOSIL® E41, available from Wacker Chemical Corporation of Adrian, Mich. (USA) can be used, in part or in whole, as the insulator layer 132. Further, a metallized layer of fluorinated ethyl-propylene (FEP) Teflon can be used to provide the electret film 140 and the second electrostatic electrode 122, where the metallization is a metallized backing that provides the second electrostatic electrode 122 and the FEP Teflon provides the electret film 140. The metallization can be or include, for example, silver and/or aluminum, or another suitable metal backing. Therefore, no additional adhesive is necessary between the electret film 140 and the second electrostatic electrode 122. Suitable metallized FEP electret films of various thicknesses are commercially available.

FIG. 2 depicts the hybrid EH device 100 in a relaxed state where no compressive stress is placed on the hybrid EH device 100. In the relaxed state, the piezoelectric nanocomposite 106 has a first thickness that is generally indicated in FIG. 2 as the thickness of the first section 106A ($T_1$) added to thickness of the second section 106B ($T_2$), i.e., $T_1+T_2$. Further, the gap 150 has a first height $H_1$, which can be from about 5 mm to about 20 mm.

Figure 3:
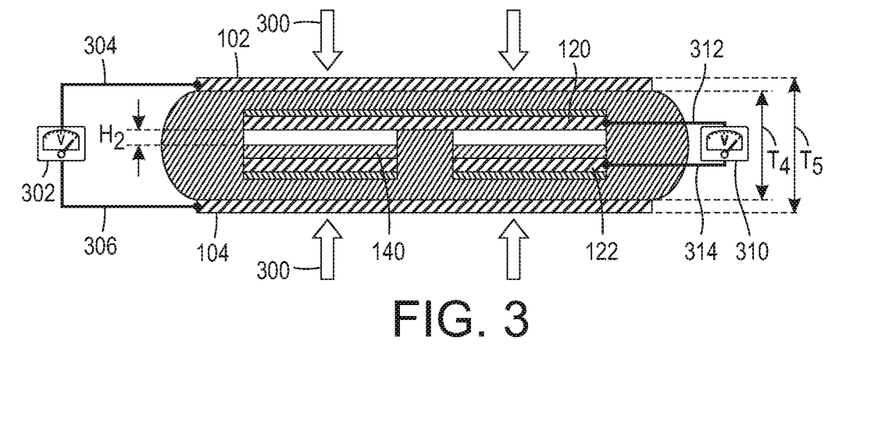
FIG. 3 is a cross section of the FIG. 1 hybrid energy harvesting device in a compressed state depicting a working principle of the FIG. 1 design.

FIG. 3 depicts the FIG. 2 EH device 100 after applying a compressive stress (i.e., compressive force, compression) 300 thereto. The compressive stress 300 can be, for example, a force of from about 1.0 grams/centimeter$^2$ (g/cm$^2$) to about 1000 kilograms/cm$^2$ (kg/cm$^2$), or from about 100 g/cm$^2$ to about 20 kg/cm$^2$, or another suitable compressive stress 300. Because the piezoelectric nanocomposite 106 is elastically deformable, a thickness of the piezoelectric nanocomposite 106 decreases from a first thickness $T_1+T_2$ depicted in FIG. 2 to a second thickness $T_4$ depicted in FIG. 3. Further, an overall thickness of the hybrid EH device 100 decreases from a third thickness $T_3$ depicted in FIG. 2 to a fourth thickness $T_5$ depicted in FIG. 3. In an implementation, thickness $T_4$ can be from about can be from about 0.1 times to about 0.9 times the thickness $T_1+T_2$, or from about 0.1 times to about 0.5 times the thickness $T_1+T_2$. Additionally, during the compression of the hybrid EH device 100, the height of the gap 150 decreases from $H_1$ depicted in FIGS. 2 to $H_2$ depicted in FIG. 3. In an implementation the height $H_2$ can be from about 0.1 times to about 0.9 times the height $H_1$, or from about 0.1 times to about 0.5 times the height $H_1$. In general, the amount of energy generated by the hybrid EH device 100 is proportional to the number of compression/decompression cycles of the hybrid EH device 100. Further, the amount of energy generated is proportional, but not necessarily linearly proportional, to the change in thickness ($\Delta T$) of the hybrid EH device 100 (e.g., where $T_3-T_5=\Delta T$, referring to FIGS. 2 and 3).

During the compression 300 of EH device 100 from the relaxed position of FIG. 2 to the compressed position of FIG. 3, the first piezoelectric electrode 102 and the second piezoelectric electrode 104 move closer to each other. Because the piezoelectric electrodes 102, 104 and the piezoelectric nanocomposite 106 provide a piezoelectric harvester, the relative movement or motion of the first piezoelectric electrode 102 and the second piezoelectric electrode 104 induces a charge between the surfaces of the two structures. The charge thus generates a first electric current 302 that can be harvested using a first interconnect 304 electrically coupled to the first piezoelectric electrode 102 and a second interconnect 306 electrically coupled to the second piezoelectric electrode 104.

Simultaneously, during the current generation by the piezoelectric harvester, the first electrostatic electrode 120 and the second electrostatic electrode 122 move closer to each other as the hybrid EH device 100 moves from the relaxed state of FIG. 2 to the compressed state of FIG. 3. Further, the first electrostatic electrode 120 and the electret film 140 move closer to each other. Because the electrostatic electrodes 120, 122 and the electret film 140 provide an electrostatic harvester, the relative movement of the electrostatic electrodes 120, 122 and the electret film 140 generates a second electric current 310 that can be harvested using a third interconnect 312 electrically coupled to the first electrostatic electrode 120 and a fourth interconnect 314 electrically coupled to the second electrostatic electrode 122. As depicted in FIG. 3, the post 108 and, more specifically, the upper surface 114 of the post 108 physically contacts the lower surface of the first electrostatic electrode 120 to prevent physical and electrical contact (i.e., electrical shorting) between the first electrostatic electrode 120 and the electret film 140.

After compressing the hybrid EH device 100 into the FIG. 3 position, the compressive stress 300 can be released. The viscoelastic properties and compressive elasticity of the piezoelectric nanocomposite 106 results in the hybrid EH device 100 returning to the FIG. 2 position. An AC (alternating current) electrical current is generated during the movement of each pair of electrostatic electrodes 120, 122 and each pair of piezoelectric electrodes 102, 104 both toward each other and away from each other, thereby generating an AC current during both compression and relaxation of the hybrid EH device 100.

Thus with the hybrid EH device 100, the piezoelectric nanocomposite 106 positions and supports both the piezoelectric electrodes 102, 104 and the electrostatic electrodes 120, 122. Further, being elastically compressible, the piezoelectric nanocomposite 106 provides an actuation structure for both the piezoelectric electrodes 102, 104 and the electrostatic electrodes 120, 122. The piezoelectric nanocomposite 106 thereby allows a deflection of the electrostatic electrodes 120, 122 relative to each other, and a deflection of the piezoelectric electrodes 102, 104 relative to each other. The piezoelectric nanocomposite 106, the first piezoelectric electrode 102, and the second piezoelectric electrode 104 provide major components of a piezoelectric harvester. The piezoelectric nanocomposite 106, the first electrostatic electrode 120, the second electrostatic electrode 122, and the electret film 140 provide major components of an electrostatic harvester. By sharing the piezoelectric nanocomposite 106, the hybrid EH device 100 can provide a compact and efficient component for generating electric energy. Further, as the voltage generation of an electrostatic converter is proportional to the capacitance change by the time, the hybrid EH device 100 is scalable to allow for an increase power output for applications with various vibration frequencies.

Various process flows for forming the structures of FIGS. 1-3 are contemplated. In an exemplary process flow, the structures of FIG. 1 can be individually or separately formed and assembled according to known techniques. As described above, the first portion 106A and the second portion 106B of the piezoelectric nanocomposite 106 can be formed using a mold or a 3D printing process. The electret film 140 and the second electrostatic electrode 122 can be formed as a metallized FEP film and processed together to form a composite structure including the electret film 140 (provided by the FEP film) and the second electrostatic electrode 122 (provided by the metallization).

Figure 4:
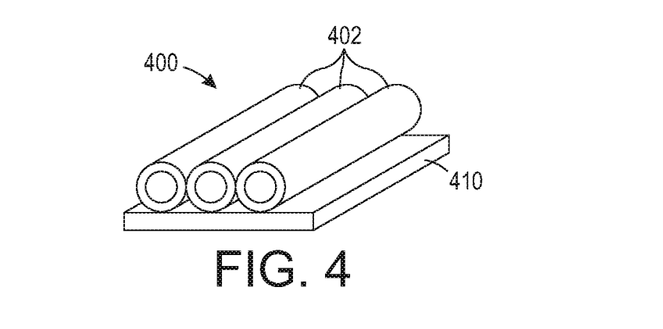
FIG. 4 is a perspective depiction of an array of hybrid energy harvesting devices.
Figure 5:
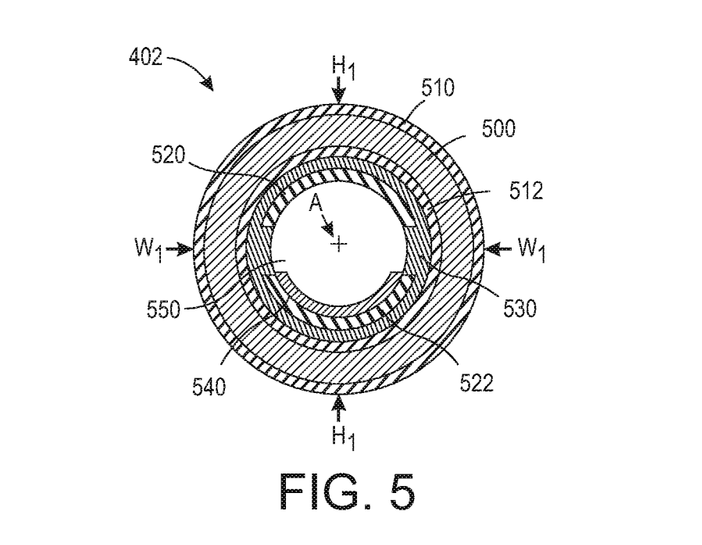
FIG. 5 is a cross section of one of the hybrid energy harvesting devices of FIG. 4 in a relaxed state.

It will be appreciated that while FIGS. 1-3 depict an example implementation of the present teachings, other implementations are contemplated. For example, FIG. 4 is a perspective depiction of a hybrid EH device array 400 including a plurality of hybrid EH devices 402, and FIG. 5 depicts a magnified end view of one of the hybrid devices 402, according to another implementation of the present teachings. While FIG. 4 depicts an array 400 of three hybrid EH devices 402, it will be appreciated that the array 400 can include any number of hybrid EH devices 402, depending on the design. As best depicted in FIG. 5, each hybrid EH device 402 can include a piezoelectric nanocomposite 500, a first piezoelectric electrode 510, a second piezoelectric electrode 512, a first electrostatic electrode 520, a second electrostatic electrode 522, an electrical insulator 530 that physically and electrically separates the electrostatic electrodes 520, 522 from the second piezoelectric electrode 512, and an electret film 540. As depicted in FIG. 4, the piezoelectric nanocomposite 500, and the hybrid EH device 402 itself, is formed as, and provides, a cylinder, where the cylinder is generally formed by the piezoelectric nanocomposite 500. In the cross section of FIG. 5, which is representative of some formation methods, the first piezoelectric electrode 510, the piezoelectric nanocomposite 500, the second piezoelectric electrode 512, and the electrical insulator 530 can each form an endless circle. In other formation methods, such as those represented by FIGS. 10-13 described below, a seam 1202 can be provided within the piezoelectric nanocomposite 500, the second piezoelectric electrode 512, and the electrical insulator 530. As also depicted in FIG. 5, the first electrostatic electrode 520, the second electrostatic electrode 522, and the electret film 540 each form an arc. Each hybrid EH device 402 can further include a void, space, or gap 550 positioned at and around a longitudinal axis A that extends through a center of the hybrid EH device 402 and the piezoelectric nanocomposite 500. As depicted in FIG. 5, the gap 550 is positioned between, and separates, the electret film 540 and the first electrostatic electrode 520, such that the first electrostatic electrode 520 provides a counter electrode. Each of the structures of FIGS. 4-6 can be formed from a material of the corresponding structure discussed above relative to FIGS. 1-3, and can have similar dimensions. Furthermore, the electrical operation of each hybrid EH device 402 is similar to that of the hybrid EH device 100 of FIGS. 1-3. The array 400 of hybrid EH devices 402 can be positioned on a supporting substrate 410, which will vary depending on the device design.

The piezoelectric nanocomposite 500 provides an elastically deformable and/or elastically compressible support for each of the piezoelectric electrodes 510, 512, each of the electrostatic electrodes 520, 522, the electrical insulator 530, and the electret film 540. The piezoelectric nanocomposite 500 is positioned between, and physically and electrically contacts, each of the first piezoelectric electrode 510 and the second piezoelectric electrode 512.

Figures 6, 7:
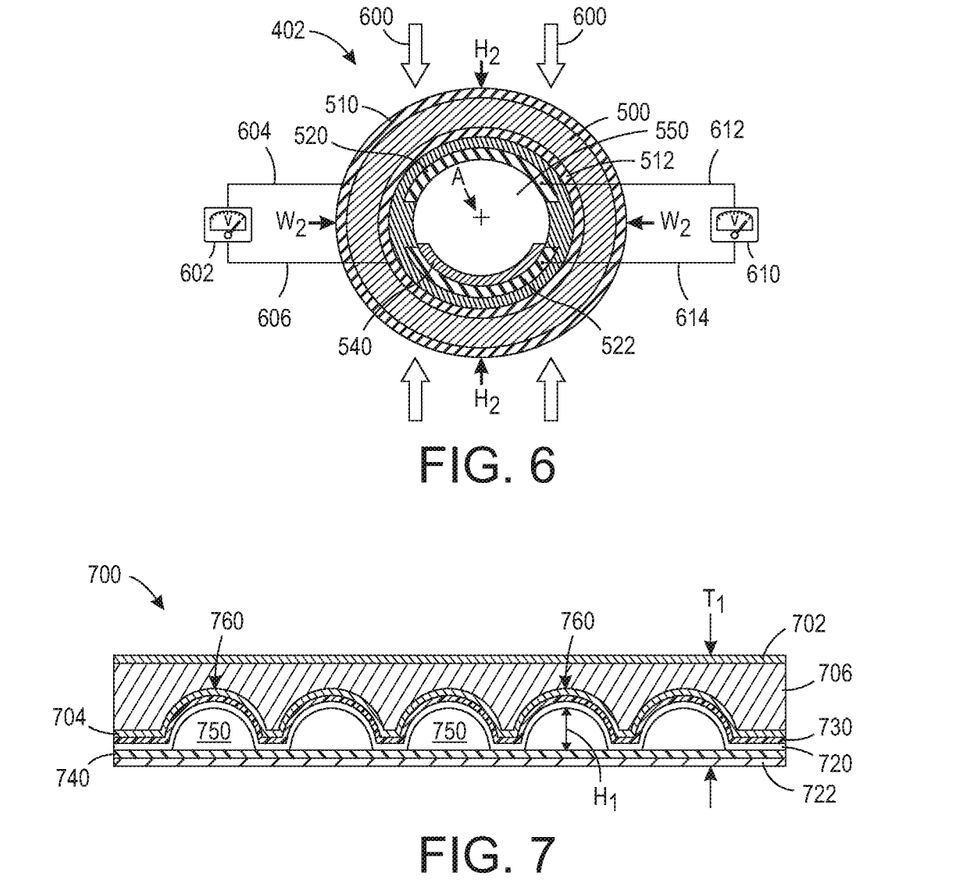
FIG. 6 is a cross section of one of the energy harvesting devices of FIG. 4 in a compressed state.
FIG. 7 is a cross section of another hybrid energy harvesting device in a relaxed state according to an implementation of the present teachings.

FIGS. 4 and 5 depicts the hybrid EH device(s) 402 in a relaxed state. FIG. 6 depicts the FIG. 5 EH device 402 after applying a compressive stress (i.e., compressive force, compression) 600 thereto. Because the piezoelectric nanocomposite 500 is elastically deformable, a height of the hybrid EH device 402 decreases from a first height $H_1$ depicted in FIG. 5 to a second height $H_2$ depicted in FIG. 6. Further, a width of the hybrid EH device 402 increases from first width $W_1$ depicted in FIG. 5 to second width $W_2$ depicted in FIG.

6. In an implementation, the height $H_1$ of the hybrid EH device 402 in the relaxed state of FIG. 5 can be equal to, or approximately equal to, the width $W_1$. For example, in the relaxed state, the height $H_1$ can be within ±1% or within ±3% of the width $W_1$. In other words, in the relaxed state, the height varies from the width by no more than ±1%, or no more than ±3%. In the compressed state, the height $H_2$ is not equal to, and does not approximately equal, the width $W_2$. For example, in the compressed state, the width $W_2$ can be from about 10% to about 100% greater, or from about 25% greater to about 50% greater, than H2. In an implementation, a diameter (e.g., at both $H_1$ and $W_1$) can be from about 5 mm to about 200, or from about 10 mm to about 50 mm.

During the compression 600 of EH device 402 from the relaxed position of FIG. 5 to the compressed position of FIG. 6, the first piezoelectric electrode 510 and the second piezoelectric electrode 512 move closer to each other. Because the piezoelectric electrodes 510, 512 and the piezoelectric nanocomposite 500 provide a piezoelectric harvester, the relative movement of the piezoelectric electrodes 510, 512 generates a first electric current 602 that can be harvested using a first interconnect 604 electrically coupled to the first piezoelectric electrode 510 and a second interconnect 606 electrically coupled to the second piezoelectric electrode 512.

Simultaneously, during the current generation by the piezoelectric harvester, the first electrostatic electrode 520 and the second electrostatic electrode 522 move closer to each other as the hybrid EH device 402 moves from the relaxed state of FIG. 5 to the compressed state of FIG. 6. Further, the first electrostatic electrode 520 and the electret film 540 move closer to each other. Because the electrostatic electrodes 520, 522 and the electret film 540 provide an electrostatic harvester, the relative movement of the electrostatic electrodes 520, 522 and the electret film 540 generate a second electric current 610 that can be harvested using a third interconnect 612 electrically coupled to the first electrostatic electrode 520 and a fourth interconnect 614 electrically coupled to the second electrostatic electrode 522.

After compressing the hybrid EH device 402 into the FIG. 6 position, the compressive stress 600 can be released. The viscoelastic properties and compressive elasticity of the piezoelectric nanocomposite 500 results in the hybrid EH device 402 returning to the FIG. 5 position. An AC (alternating current) electrical current is generated during the movement of each pair of electrostatic electrodes 520, 522, and each pair of piezoelectric electrodes 510, 512, both toward each other and away from each other, thereby generating an AC current during both compression and relaxation of the hybrid EH device 402.

Figure 10:
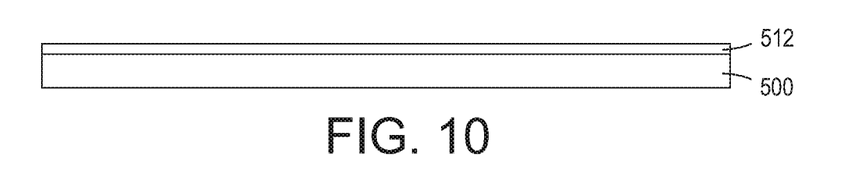
FIG. 10 is a cross section of a first in-process structure including a second piezoelectric electrode and a piezoelectric nanocomposite formed during the manufacture of the FIG. 5 device.

Various process flows for forming the structure of FIGS. 4-6 are contemplated, where an example process flow is depicted in the schematic cross sections of FIGS. 10-13. FIG. 10 depicts the piezoelectric nanocomposite 500 provided as a planar layer. As described above, the piezoelectric nanocomposite can be synthesized as a layer of PDMS/BTO/CNT or another suitable material. Subsequently, the second piezoelectric electrode 512 is deposited as a planar layer on the piezoelectric nanocomposite 500, then the piezoelectric nanocomposite 500 is poled in accordance with known techniques using a corona discharge to induce the piezoelectric characteristics to complete the structure of FIG. 10.

Figure 11:
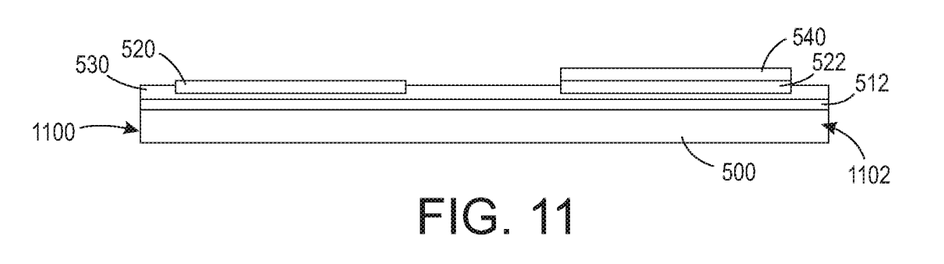
FIG. 11 is a cross section of the FIG. 10 in-process structure after additional processing to provide electrostatic electrodes and an electret film.

Next, a metallized electret material, such as the metallized FEP Teflon described above, can be charged using a corona discharge to form the electret film 540, then attached to the FIG. 1 structure as depicted in FIG. 11, thereby providing both the second electrostatic electrode 522 and the electret film 540. Further, the first electrostatic electrode 520 can be formed and attached to the FIG. 1 structure as depicted in FIG. 11. The first electrostatic electrode 520 and the metallized electret film (including the second electrostatic electrode 522 and the electret film 540) can be bonded to the second piezoelectric electrode 512 using, for example, an insulator 530 such as PDMS, an epoxy, or another suitable material. The bonding of the electrostatic electrodes 520, 522 and the electret film 540 to the structure of FIG. 10 results in the FIG. 11 structure. As depicted, the structure of FIG. 11 includes a first lateral end 1100 and a second lateral end 1102 that is opposite the first lateral end 1100.

Figure 12:
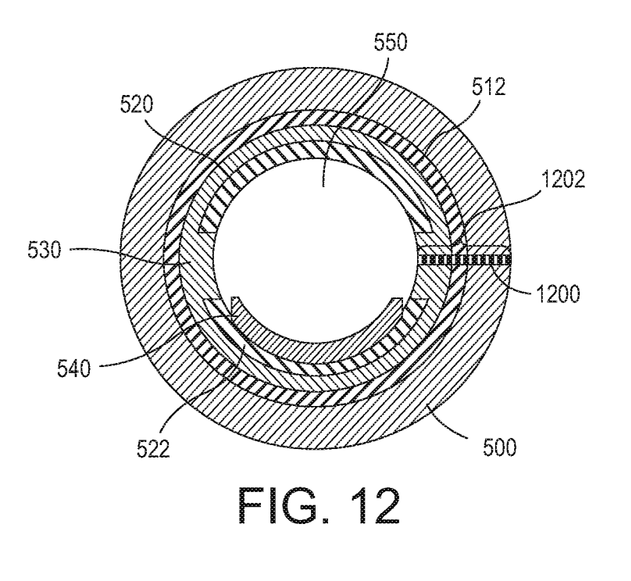
FIG. 12 is a cross section of the FIG. 11 in-process structure after additional processing to shape the FIG. 10 structure into a cylinder.

Next, the FIG. 11 structure is shaped into the tubular shape of FIG. 12 by bending or wrapping the FIG. 11 structure to bring the first and second lateral ends 1100, 1102 in proximity to each other. The first and second lateral ends 1100, 1102 are bonded together using an adhesive 1200, for example, an electrically insulative adhesive such as an epoxy. Bonding the first lateral end 1100 to the second lateral end 1102 forms the gap 150 and results in the structure of FIG. 12. FIG. 12 further depicts a seam 1202 that, in some implementations, physically spaces the first lateral end 1100 from the second lateral end 1102.

Figure 13:
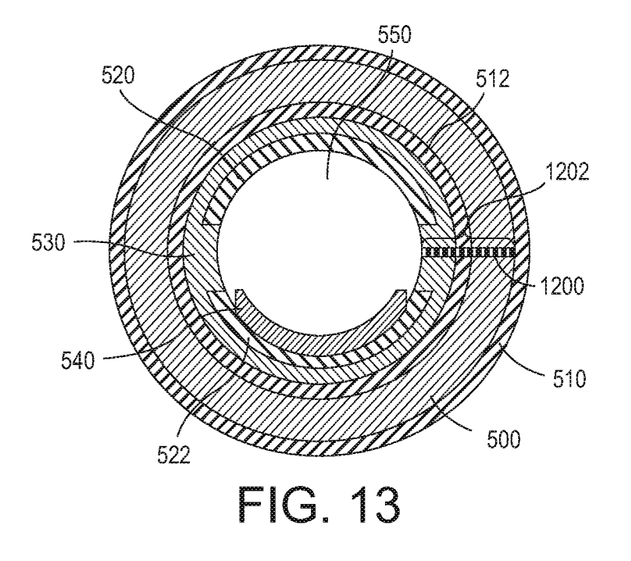
FIG. 13 is a cross section of the FIG. 12 in-process structure after additional processing to form a first piezoelectric electrode on an outer surface of the piezoelectric nanocomposite.

After forming the structure of FIG. 12, the first piezoelectric electrode 510 is formed on an outer surface of the FIG. 12 structure to result in the structure of FIG. 13, which corresponds to the structure of FIG. 5. Additional processing of the FIG. 13 structure can be performed, for example, formation of the electrical interconnects 604, 606, 612, and 614 to the piezoelectric electrodes 510, 512 and the electrostatic electrodes 520, 522.

Figure 8:
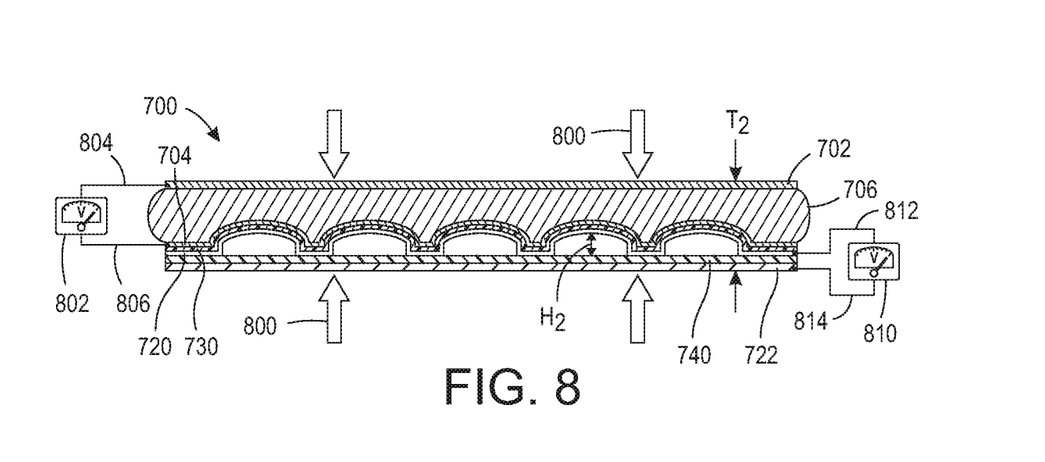
FIG. 8 is a cross section of the hybrid energy harvesting device of FIG. 7 in a compressed state.

Another implementation that includes a hybrid EH device 700 is depicted in the side views of FIGS. 7 and 8. The hybrid EH device 700 of FIG. 7 includes a piezoelectric harvester having a first piezoelectric electrode 702, a second piezoelectric electrode 704, and a piezoelectric nanocomposite 706 positioned between, and physically separating, the first piezoelectric electrode 702 and the second piezoelectric electrode 704. The FIG. 7 device further includes an electrostatic harvester having a first electrostatic electrode 720, a second electrostatic electrode 722, and an electret film 740 that physically and separates the two electrostatic electrodes 720, 722. The FIG. 7 device 700 further includes an insulator 730 positioned between, and physically and electrically separating, the second piezoelectric electrode 704 from the first electrostatic electrode 720.

As depicted in FIG. 7, the hybrid EH device 700 is assembled to include at least one void, space, or gap 750, such that the first electrostatic electrode 720 provides a counter electrode. The device 700 of FIG. 7 includes a plurality of gaps 750, with five gaps being depicted, it will be appreciated that other device designs can include more or fewer than five gaps 750. As depicted in FIG. 7, for example, the gaps 750 are positioned between, and physically separate, the electret film 740 and the first electrostatic electrode 720. As further depicted in FIG. 7, the gaps 750 are defined, at least in part, by the first electrostatic electrode 720 and the electret film 740. The gaps 750 can be filled with a gas such as air, or another suitable gas.

During formation of the hybrid EH device 700, the piezoelectric nanocomposite 706 can be formed to include one or more arches 760 to provide an arched or scalloped surface of the piezoelectric nanocomposite 706. The piezoelectric nanocomposite 706, either before or after the formation of the arches 760, can be attached to the first piezoelectric electrode 702. After forming the arches 760, the second piezoelectric electrode 704, the insulator 730, and the first electrostatic electrode 720 can be formed as conformal layers over the arches 760 of the piezoelectric nanocomposite 706. The electret film 740 and the second electrostatic electrode 722 can be formed as flat, blanket, or planar layers, and subsequently applied to the first electrostatic electrode 720 to complete the formation of the hybrid EH device 700. The materials and thicknesses of each of the layers of FIG. 7 can correspond to one or more of the implementations discussed above.

FIG. 8 depicts the FIG. 7 EH device 700 after applying a compressive stress (i.e., compressive force, compression) 800 thereto. The compressive stress 800 can be, for example, a force of from about 1.0 grams/centimeter$^2$ (g/cm$^2$) to about 1000 kilograms/cm$^2$ (kg/cm$^2$), or from about 100 g/cm$^2$ to about 20 kg/cm$^2$, or another suitable compressive stress 800. Because the piezoelectric nanocomposite 706 is elastically deformable, an outside or overall thickness of the hybrid EH device 700 decreases from a first thickness $T_1$ depicted in FIG. 7 to a second thickness $T_2$ depicted in FIG. 8. In an implementation, thickness $T_2$ can be from about can be from about 0.1 times to about 0.9 times the thickness $T_1$, or from about 0.1 times to about 0.5 times the thickness $T_1$. Additionally, during the compression of the hybrid EH device 100, the height of the gap 750 decreases from $H_1$ depicted in FIGS. 7 to $H_2$ depicted in FIG. 8. In an implementation, height $H_2$ can be from about 0.1 times to about 0.9 times the height $H_1$, or from about 0.1 times to about 0.5 times the height $H_1$.

During the compression 800 of EH device 700 from the relaxed position of FIG. 7 to the compressed position of FIG. 8, the first piezoelectric electrode 702 and the second piezoelectric electrode 704 move closer to each other. Because the piezoelectric electrodes 702, 704 and the piezoelectric nanocomposite 706 provide a piezoelectric harvester, the relative movement or motion of the first piezoelectric electrode 702 and the second piezoelectric electrode 704 induces a charge between the surfaces of the two structures. The charge thus generates a first electric current 802 that can be harvested using a first interconnect 804 electrically coupled to the first piezoelectric electrode 702 and a second interconnect 806 electrically coupled to the second piezoelectric electrode 704.

Simultaneously, during the current generation by the piezoelectric harvester, the first electrostatic electrode 720 and the second electrostatic electrode 722 move closer to each other at the location of the gaps 750 as the hybrid EH device 700 moves from the relaxed state of FIG. 7 to the compressed state of FIG. 8. Further, the first electrostatic electrode 720 and the electret film 740 move closer to each other. Because the electrostatic electrodes 720, 722 and the electret film 740 provide an electrostatic harvester, the relative movement of the electrostatic electrodes 720, 722 and the electret film 740 generates a second electric current 810 that can be harvested using a third interconnect 812 electrically coupled to the first electrostatic electrode 720 and a fourth interconnect 814 electrically coupled to the second electrostatic electrode 722.

After compressing the hybrid EH device 700 into the FIG. 8 position, the compressive stress 800 can be released. The viscoelastic properties and compressive elasticity of the piezoelectric nanocomposite 706 results in the hybrid EH device 700 returning to the FIG. 7 position. An AC (alternating current) electrical current is generated during the movement of each pair of electrostatic electrodes 720, 722 and each pair of piezoelectric electrodes 702, 704 both toward each other and away from each other, thereby generating an AC current during both compression and relaxation of the hybrid EH device 700.

Thus with the hybrid EH device 700, the piezoelectric nanocomposite 706 positions and supports both the piezoelectric electrodes 702, 704 and the electrostatic electrodes 720, 722. Further, being elastically compressible, the piezoelectric nanocomposite 706 provides an actuation structure for both the piezoelectric electrodes 702, 704 and the electrostatic electrodes 720, 722. The piezoelectric nanocomposite 706 thereby allows a deflection of the electrostatic electrodes 720, 722 relative to each other, and a deflection of the piezoelectric electrodes 702, 704 relative to each other. The piezoelectric nanocomposite 706, the first piezoelectric electrode 702, and the second piezoelectric electrode 704 provide major components of a piezoelectric harvester. The piezoelectric nanocomposite 706, the first electrostatic electrode 720, the second electrostatic electrode 722, and the electret film 740 provide major components of an electrostatic harvester. By sharing the piezoelectric nanocomposite 706, the hybrid EH device 700 can provide a compact and efficient component for generating electric energy. Further, as the voltage generation of an electrostatic converter is proportional to the capacitance change by the time, the hybrid EH device 700 is scalable to allow for an increase power output for applications with various vibration frequencies.

Various process flows for forming the structure of FIG. 7 are contemplated. In an implementation, the piezoelectric nanocomposite 706 can be synthesized from the PDMS/BTO/CNT material as described above using a mold, a 3D printing process, or another suitable method. The piezoelectric nanocomposite 706 can then be poled using a corona discharge as known in the art. subsequently, the piezoelectric electrodes 702, 704 can be deposited as conformal layers on the piezoelectric nanocomposite 706 as depicted in FIG. 7. Next, the insulator 730 and the first electrostatic electrode 720 can be sequentially and conformally deposited on the second piezoelectric electrode 704 as depicted in FIG. 7. Next, a metallized electret material, such as the metallized FEP Teflon described above, can be charged using a corona discharge to form the electret film 740 and the second electrostatic electrode 722, where the FEP Teflon provides the electret film and the metallization provides the second electrostatic electrode 722. The metallized electret material, specifically the electret film 740 with the metallized backing that provides the second electrostatic electrode 722, is then bonded to the first electrostatic electrode 720 to result in the FIG. 7 structure. The electret film 740 can be bonded to the first electrostatic electrode 720 using adhesive (not depicted in FIG. 7 for simplicity), for example, an electrically insulative adhesive such as PDMS, an epoxy, or another suitable material.

Figure 9:
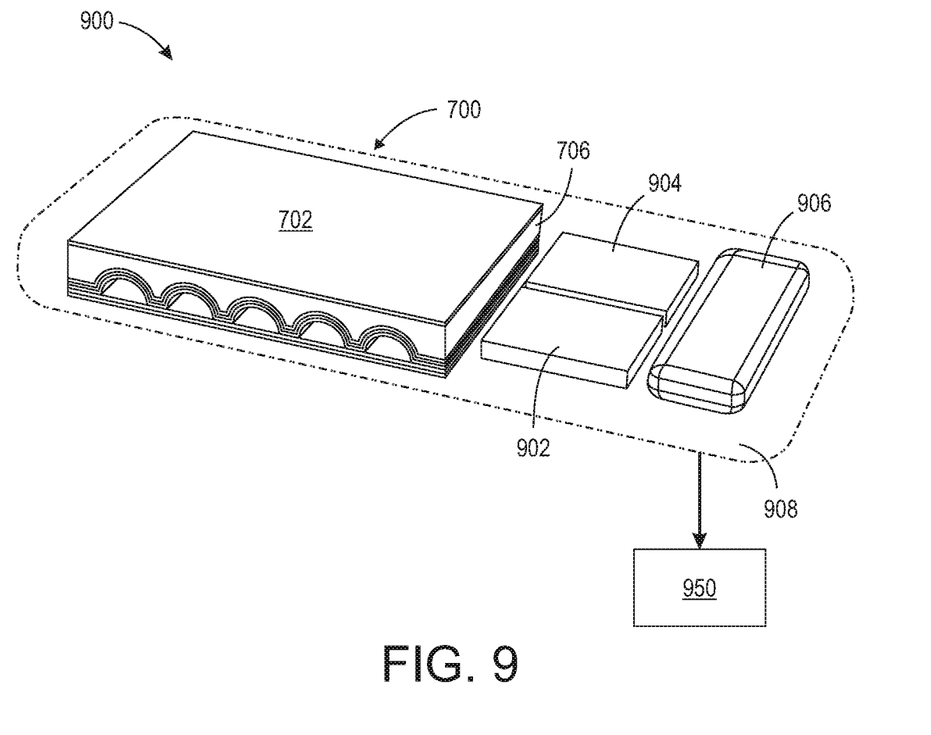
FIG. 9 is a perspective depiction of an energy harvesting system according to an implementation of the present teachings.

FIG. 9 depicts an energy harvesting system 900 that incorporates the hybrid EH device 700 of FIGS. 7 and 8. It will be appreciated that a similar energy harvesting system can use other hybrid EH devices such as those depicted in FIGS. 1-6. The energy harvesting system 900 of FIG. 9 can include additional components, such as a piezoelectric energy harvesting circuit 902, an electrostatic energy harvesting circuit 904, and an electric energy storage system 906, for example, one or more storage cells or one or more batteries. For simplicity, the electric energy storage system 906 is referenced herein as a battery 906. The piezoelectric energy harvesting circuit 902, which receives piezoelectric energy generated by the hybrid EH device 700 and converts the piezoelectric energy to electric energy, can be electrically coupled to the piezoelectric electrodes 702, 704 using the interconnects 804, 806 depicted in FIG. 8. The electrostatic energy harvesting circuit 904, which receives electrostatic energy generated by the hybrid EH device 700 and converts the electrostatic energy to electric energy, can be electrically coupled to the electrostatic electrodes 720, 722 using the interconnects 812, 814 depicted in FIG. 8. The battery 906 receives the electric energy converted from the piezoelectric energy by the piezoelectric energy harvesting circuit 904 and the electric energy converted from the electrostatic energy by the electrostatic energy harvesting circuit 902, and stores the electric energy for used by an electrically operated electronic device 950. One or more of the hybrid EH device 700, the piezoelectric energy harvesting circuit 902, the electrostatic energy harvesting circuit 904, and/or the battery 906 can be encased in a housing 908 that encloses and protects the one or more components of the energy harvesting system 900. The housing 908 can be or include a flexible material, such as a silicone or another flexible polymer or material, that compressibly encases the hybrid EH device 700 such that the hybrid EH device 700 is elastically compressible and operational.

Thus, as discussed above, a new, flexible, and hybrid energy harvesting device is provided. In order to harvest mechanical energy from the ambient, the exemplary devices according to the present teachings utilize a combination and the simultaneous use of electrostatic and piezoelectric energy conversion methods. A main body of the device includes a piezoelectric nanocomposite polymer, an electret film, and electrodes. Further, the device incorporates the use of soft and flexible piezoelectric nanocomposites and thin-film electrets and electrodes, and thus the device can be easily bent, stretched, compressed, and otherwise stressed without damage to the device. It will be appreciated that process flows for forming the devices described above, and variations to the devices described above, will be apparent to those of ordinary skill in the art.

According to the present teachings, a combination of a thin film-based electrostatic energy harvester and a nanocomposite polymer-based piezoelectric energy harvester has various advantages over some prior devices. For example, by using both piezoelectric and electrostatic harvesters, the device increases and enhances total power generation per unit volume of the system. Further, the device described herein has an improved mechanical flexibility with a reduced total weight of the system by using polymer-based and thin-film-based materials. Additionally, the device described herein extends the optimal operating frequency range of the system compared to some prior systems. Piezoelectric energy harvesters normally have a narrow bandwith operational frequency, which is one of the most challenging issues that vibrational energy harvesters have to overcome. On the other hand, electrostatic energy harvesters can opearate over a wide frequency range. The inclusion of both piezoelectric and electrostatic energy harvesting according to the present teachings offers a synergistic combination of technologies in a single device that has a wideband operational frequency.

Thus, a hybrid EH device according to the present teachings includes the two main components as summarized below:

Electrostatic Harvester

The electrostatic harvester used in the device is based on a thin film capacitive structure including an electret film and a counter electrode, where the counter electrode is provided by a first electrostatic electrode. Relative motion (i.e., mechanical energy) between the electret film and the counter electrode induces electrical charges as illustrated, for example, in FIG. 3, thereby generating electric energy. In the disclosed device, as the electret-film material, a metalized FEP film can be used, thus forming the other electrode. Since the voltage generation of an electrostatic converter is proportional to the capacitance change by the time, the disclosed system can be scalable to increase power output for applications with various vibration frequencies. Both the electret film and counter electrode can be made of highly flexible thin-films. Therefore, the electrostatic harvester device can provide a flexible structure for the device.

Piezoelectric Harvester

In the disclosed system, a polymer-based piezoelectric nanocomposite (p-NC) is used as the piezoelectric converter due to its high conversion efficiency, flexibility in shape formation, and accommodation of significant deformation. When mechanical energy such as pressure is applied to a piezoelectric composite, electrical charges are induced between the two surfaces, thereby generating electric energy. The piezoelectric nanocomposite is composed of a polymeric matrix, piezoelectric nanoparticles, and conductive additives. PDMS/BTO/CNT made of a piezoelectric composite made of polydimethylsiloxane (PDMS) matrix, $BaTiO_3$ piezoelectric nanoparticles (BTO), and multiwalled carbon nanotubes conductive additives (CNTs) can be used as a piezoelectric nanocomposite. It can prepare and synthesized in any desired shape and size as disclosed, for example, in, Li, J., Zhu, Z., Fang, L., Guo, Erturun, U., Zhu, Z., & Kang, S. H. (2017). Analytical, numerical, and experimental studies of viscoelastic effects on the performance of soft piezoelectric nanocomposites. *Nanoscale,* 9(37), 1421514228, which is incorporated by reference herein in its entirety.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or examples of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated example. Finally, "exemplary" indicates the description is used as an example, rather than implying that it is an ideal. Other examples of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. An energy harvesting device for energy harvesting, comprising:
    a piezoelectric harvester comprising a first piezoelectric electrode, a second piezoelectric electrode, and a piezoelectric nanocomposite positioned between the first piezoelectric electrode and the second piezoelectric electrode; and
    an electrostatic harvester comprising a first electrostatic electrode, a second electrostatic electrode, and an electret film positioned between the first electrostatic electrode and the second electrostatic electrode,
    wherein the piezoelectric nanocomposite is physically positioned between the first piezoelectric electrode and the first electrostatic electrode, and
    wherein the first electrostatic electrode, the second electrostatic electrode, and the electret film are positioned directly between the first piezoelectric electrode and the second piezoelectric electrode.

2. The energy harvesting device of claim 1, wherein the piezoelectric nanocomposite physically supports the first piezoelectric electrode, the second piezoelectric electrode, the first electrostatic electrode, and the second electrostatic electrode.

3. The energy harvesting device of claim 2, wherein the piezoelectric nanocomposite comprises:
    a first section that physically supports the first piezoelectric electrode and the first electrostatic electrode; and
    a second section that physically supports the second piezoelectric electrode and the second electrostatic electrode,
    wherein the first section is physically and electrically attached to the second section.

4. The energy harvesting device of claim 2, wherein:
    the piezoelectric nanocomposite comprises a post;
    the second electrostatic electrode comprises a first aperture therethrough, wherein the post extends through the first aperture; and
    the electret film comprises a second aperture therethrough, wherein the post extends through the second aperture.

5. The energy harvesting device of claim 2, wherein:
    the piezoelectric nanocomposite, the first electrostatic electrode, and the electret film form a gap filled with a gas; and
    the gap is positioned between, and separates, the electret film and the first electrostatic electrode.

6. The energy harvesting device of claim 2, wherein the piezoelectric nanocomposite provides a cylinder having a longitudinal axis that extends through the cylinder.

7. The energy harvesting device of claim 6, further comprising a gap positioned at and around the longitudinal axis, wherein the gap is positioned between, and separates, the electret film and the first electrostatic electrode.

8. The energy harvesting device of claim 7, wherein:
    the energy harvesting device comprises a height and a width;
    when the energy harvesting device is in a relaxed state, the height varies from the width by no more than ±3%; and
    when the energy harvesting device is in a compressed state, the width is from about 10% to about 100% greater than the height.

9. The energy harvesting device of claim 7 wherein, in a cross section through the energy harvesting device:
    the first piezoelectric electrode, the second piezoelectric electrode, and the piezoelectric nanocomposite each form an endless circle; and
    in the cross section, the first electrostatic electrode, the second electrostatic electrode, and the electret film each form an arc.

10. The energy harvesting device of claim 1, wherein:
    the piezoelectric nanocomposite is physically positioned between the second piezoelectric electrode and the second electrostatic electrode;
    the piezoelectric nanocomposite physically supports the first piezoelectric electrode, the second piezoelectric electrode, the first electrostatic electrode, and the second electrostatic electrode;
    the energy harvesting device further comprises a gap positioned between the first electrostatic electrode and the electret film; and
    the gap is filled with a gas.

11. The energy harvesting device of claim 1, wherein:
    the piezoelectric nanocomposite comprises a surface having at least one arch;
    the second piezoelectric electrode is a first conformal layer positioned on the surface and comprises an arch;
    the energy harvesting device further comprises an insulator;
    the insulator is a second conformal layer positioned on the second piezoelectric electrode and comprises an arch;
    the first electrostatic electrode is a third conformal layer positioned on the insulator and comprises an arch;

the electret film is a planar electret film positioned on the first electrostatic electrode; and the second electrostatic electrode is a planar second electrostatic electrode positioned on the electret film.

12. The energy harvesting device of claim 11, further comprising at least one gas-filled gap positioned between, and defined by, the first electrostatic electrode and the electret film.

13. The energy harvesting device of claim 12, wherein:

the piezoelectric nanocomposite comprises a plurality of arches that form a scalloped surface of the piezoelectric nanocomposite; and the energy harvesting device further comprises a plurality of gas-filled gaps positioned between, and defined by, the first electrostatic electrode and the electret film.

14. The energy harvesting device of claim 12, wherein:

the energy harvesting device further comprises a relaxed state;

in the relaxed state, the energy harvesting device comprises a first thickness;

the energy harvesting device further comprises a compressed state;

in the compressed state, the energy harvesting device comprises a second thickness; and the second thickness is less than the first thickness.

15. The energy harvesting device of claim 14, wherein:

when the energy harvesting device is in the relaxed state, the at least one gas-filled gap has a first height;

when the energy harvesting device is in the compressed state, the at least one gap has a second height; and the second height is less than the first height.

16. An energy harvesting system, comprising:

an energy harvesting device, comprising:

a piezoelectric harvester comprising a first piezoelectric electrode, a second piezoelectric electrode, and a piezoelectric nanocomposite positioned between the first piezoelectric electrode and the second piezoelectric electrode, wherein the piezoelectric nanocomposite provides a cylinder having a longitudinal axes that extends through the cylinder; and an electrostatic harvester comprising a first electrostatic electrode, a second electrostatic electrode, and an electret film positioned between the first electrostatic electrode and the second electrostatic electrode;

a piezoelectric energy harvesting circuit electrically coupled to the piezoelectric harvester, wherein the piezoelectric energy harvesting circuit is configured to convert piezoelectric energy to electric energy;

an electrostatic energy harvesting circuit electrically coupled to the electrostatic harvester, wherein the electrostatic energy harvesting circuit is configured to convert electrostatic energy to electric energy; and an electric energy storage system electrically coupled to the piezoelectric energy harvesting circuit and the electrostatic energy harvesting circuit.

17. The energy harvesting system of claim 16, further comprising at least one gas-filled gap positioned between the first electrostatic electrode and the second electrostatic electrode.

18. A method for generating electric energy using an energy harvesting device, comprising:

moving a first piezoelectric electrode supported by a piezoelectric nanocomposite and a second piezoelectric electrode supported by the piezoelectric nanocomposite relative to each other thereby generating a first portion of the electric energy; and moving a counter electrode supported by the piezoelectric nanocomposite and an electret film supported by the piezoelectric nanocomposite relative to each other thereby generating a second portion of the electric energy, wherein the generating of the first portion of the electric energy occurs simultaneously with the generating of the second portion of the electric energy.

* * * * *